(12) United States Patent
Hu et al.

(10) Patent No.: US 11,387,369 B2
(45) Date of Patent: Jul. 12, 2022

(54) SEMICONDUCTOR STRUCTURE FORMATION

(71) Applicant: Micron Technology, Inc., Boise, ID (US)

(72) Inventors: Shen Hu, Boise, ID (US); Hung-Wei Liu, Meridian, ID (US); Xiao Li, Boise, ID (US); Zhiqiang Xie, Meridian, ID (US); Corey Staller, Boise, ID (US); Jeffery B. Hull, Boise, ID (US); Anish A. Khandekar, Boise, ID (US); Thomas A. Figura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 16/723,259

(22) Filed: Dec. 20, 2019

(65) Prior Publication Data

US 2021/0193843 A1    Jun. 24, 2021

(51) Int. Cl.
*H01L 27/108* (2006.01)
*H01L 29/786* (2006.01)
*H01L 29/66* (2006.01)
*H01L 21/02* (2006.01)

(52) U.S. Cl.
CPC .. *H01L 29/78642* (2013.01); *H01L 21/02112* (2013.01); *H01L 29/66666* (2013.01)

(58) Field of Classification Search
CPC ......... H01L 27/10808; H01L 27/10852; H01L 29/78648; H01L 29/66666
See application file for complete search history.

(56) References Cited

U.S. PATENT DOCUMENTS

| 7,662,693 B2 | 2/2010 | Bhattacharyya |
| 7,875,529 B2 | 1/2011 | Forbes et al. |
| 8,274,777 B2 | 9/2012 | Kiehlbauch |
| 2021/0193843 A1* | 6/2021 | Hu .................... H01L 29/78642 |

* cited by examiner

*Primary Examiner* — Mark V Prenty
(74) *Attorney, Agent, or Firm* — Brooks, Cameron & Huebsch, PLLC

(57) ABSTRACT

An example apparatus includes forming a working surface of a substrate material. The example apparatus includes trench formed between two semiconductor structures on the working surface of the substrate material. The example apparatus further includes access lines formed on neighboring sidewalls of the semiconductor structures opposing a channel region separating a first source/drain region and a second source/drain region. The example apparatus further includes a time-control formed inhibitor material formed over a portion of the sidewalls of the semiconductor structures. The example apparatus further includes a dielectric material formed over the semiconductor structures to enclose a non-solid space between the access lines.

14 Claims, 10 Drawing Sheets

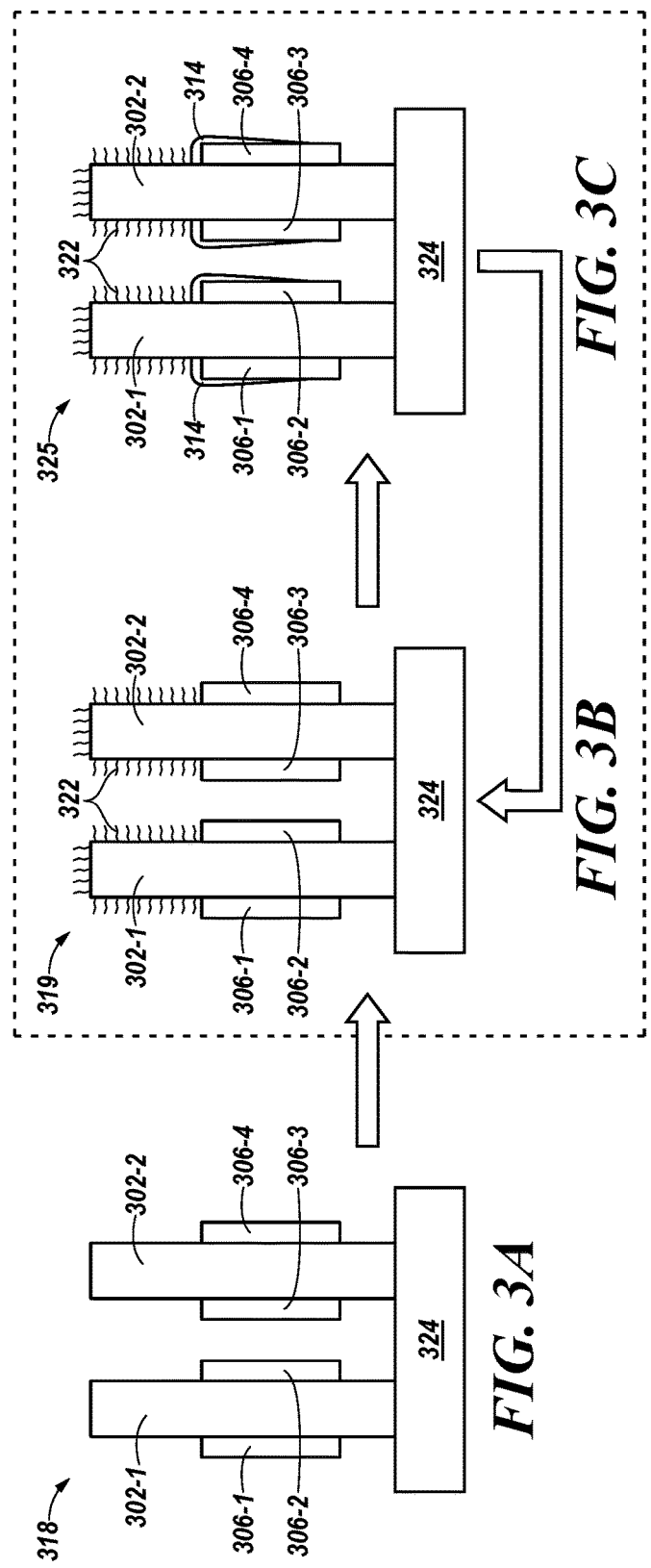

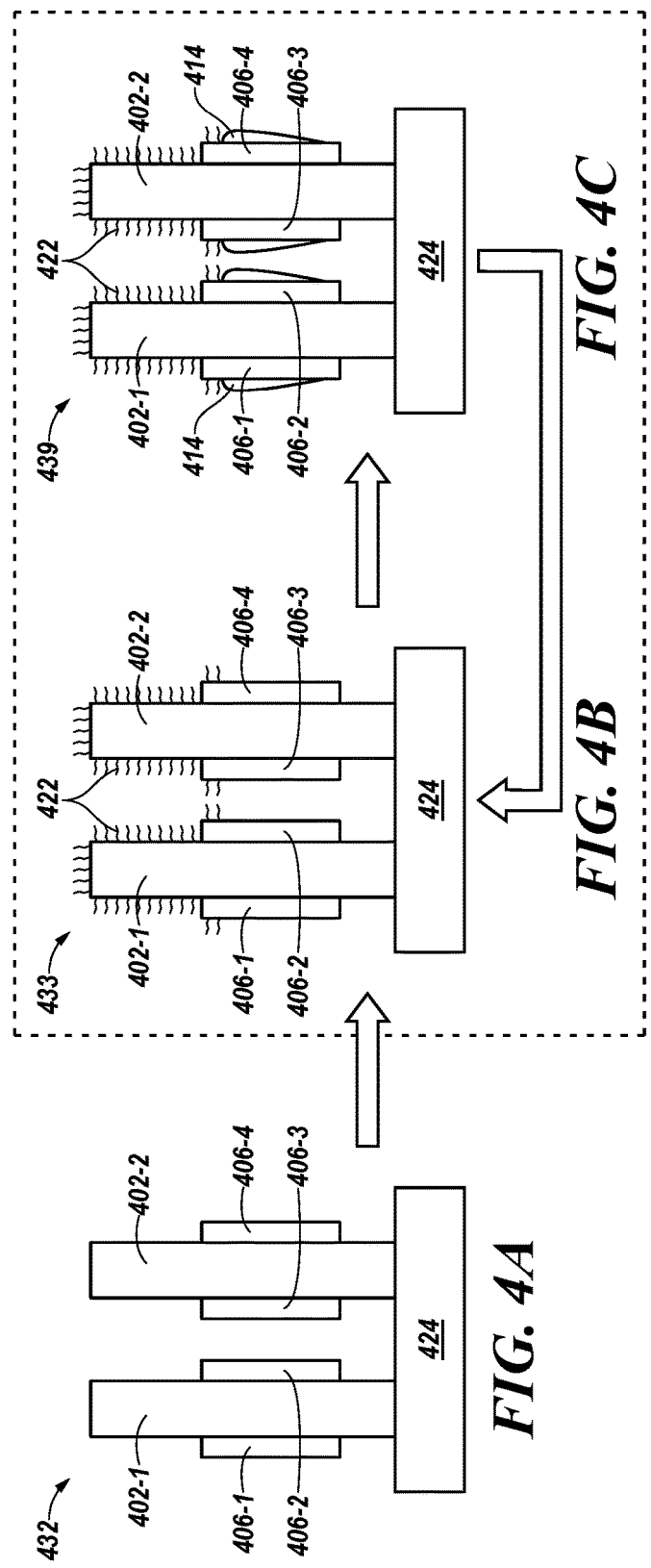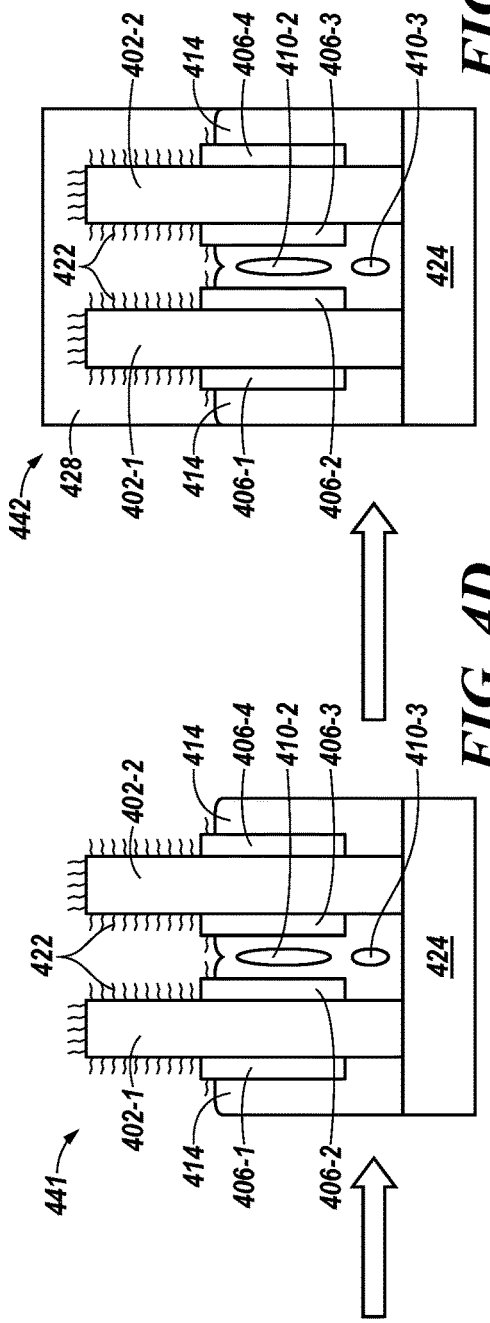

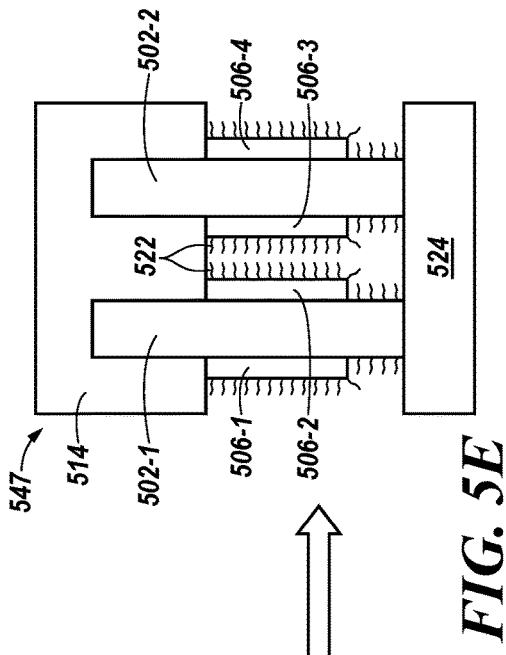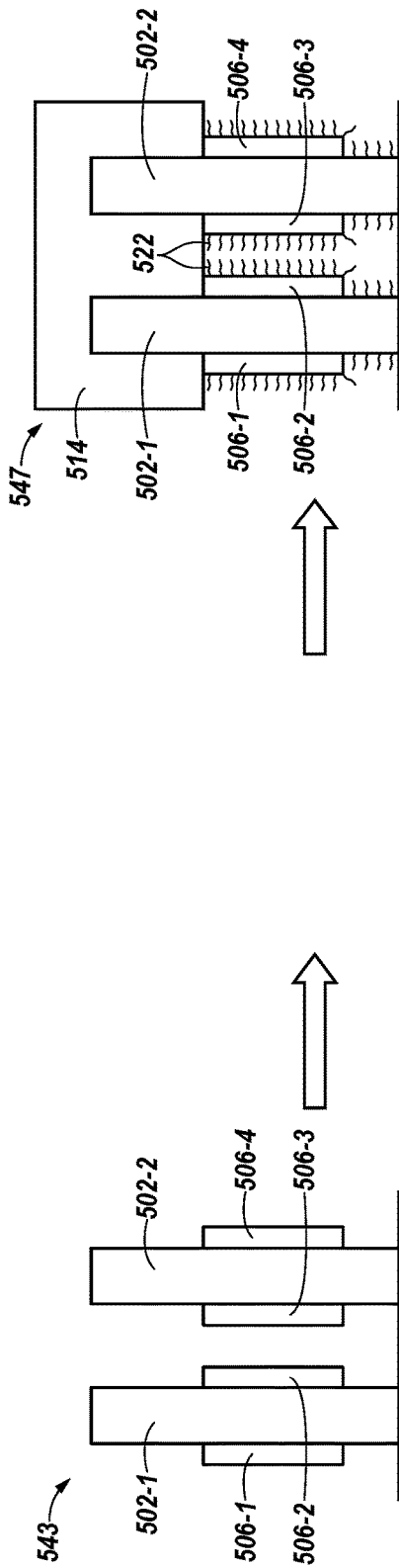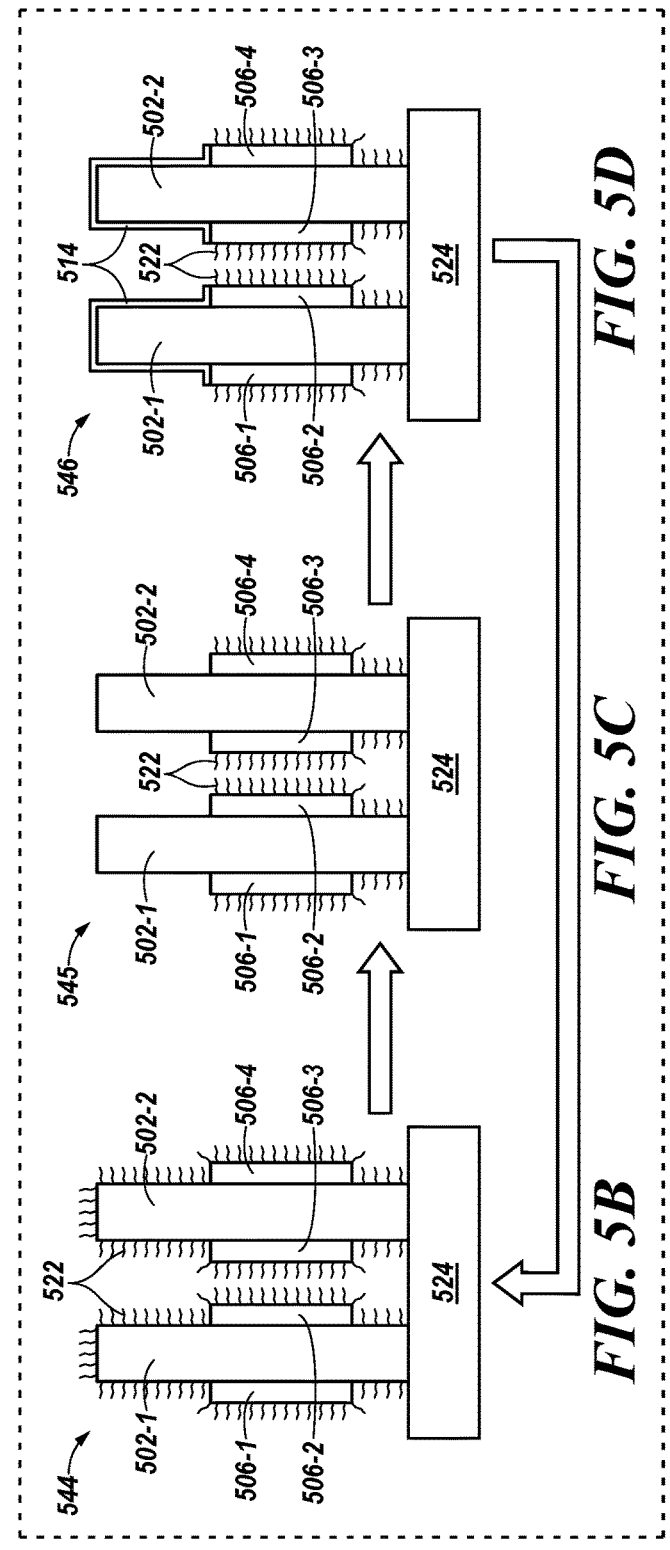

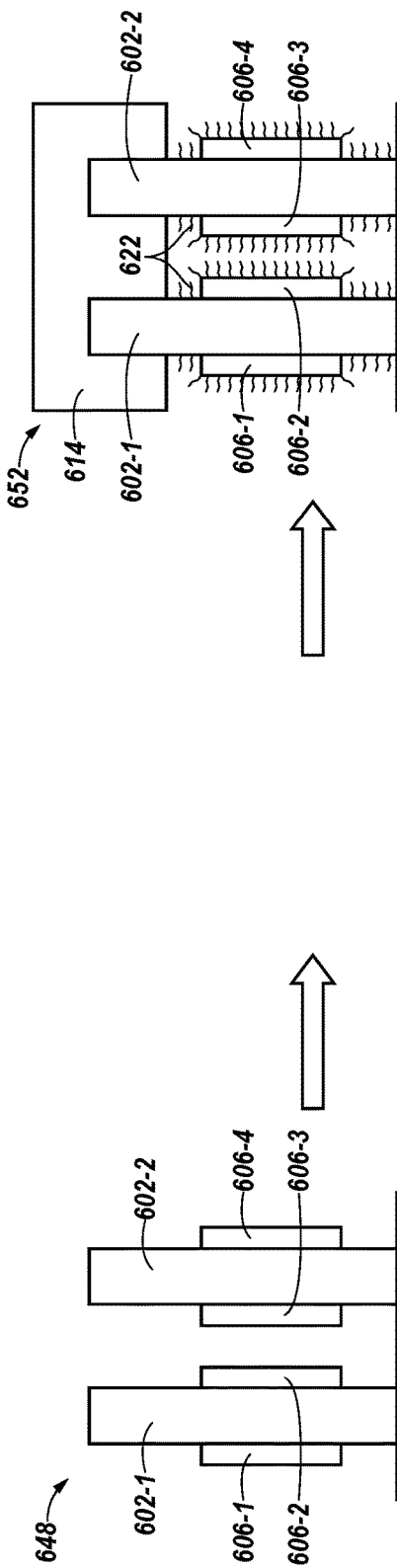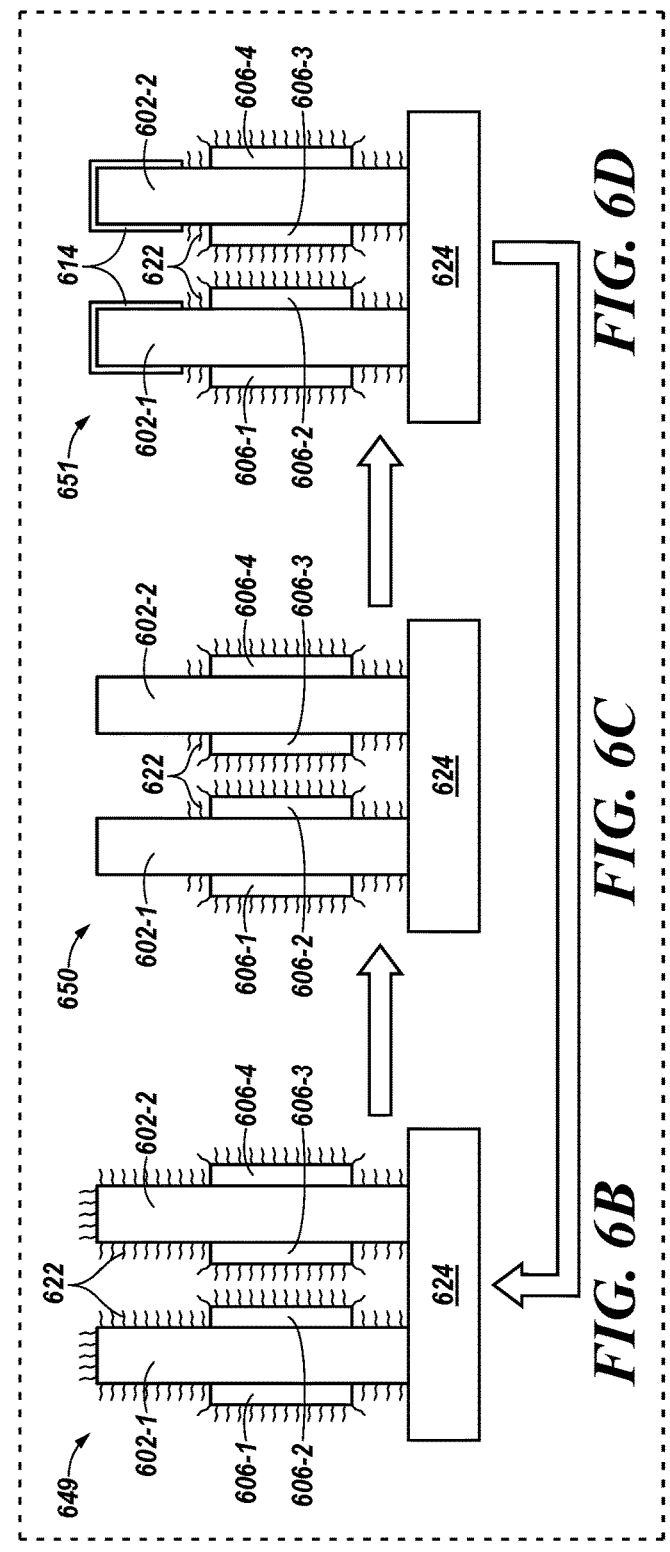

SEMICONDUCTOR STRUCTURE FORMATION

TECHNICAL FIELD

The present disclosure relates generally to semiconductor devices and methods, and more particularly to growth inhibition in semiconductor structures.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 3A-3E illustrate example cross-sectional views of dielectric deposition reducing the formation of air gaps above an access line in a semiconductor structure in accordance with a number of embodiments of the present disclosure.

FIGS. 4A-4E illustrate example cross-sectional views of another dielectric deposition reducing the formation of air gaps above an access line in a semiconductor structure in accordance with a number of embodiments of the present disclosure.

FIGS. 5A-5E illustrate example cross-sectional views of another dielectric deposition reducing the formation of air gaps above an access line in a semiconductor structure in accordance with a number of embodiments of the present disclosure.

FIGS. 6A-6E illustrate example cross-sectional views of another dielectric deposition reducing the formation of air gaps above an access line in a semiconductor structure in accordance with a number of embodiments of the present disclosure.

DETAILED DESCRIPTION

Figure 1:
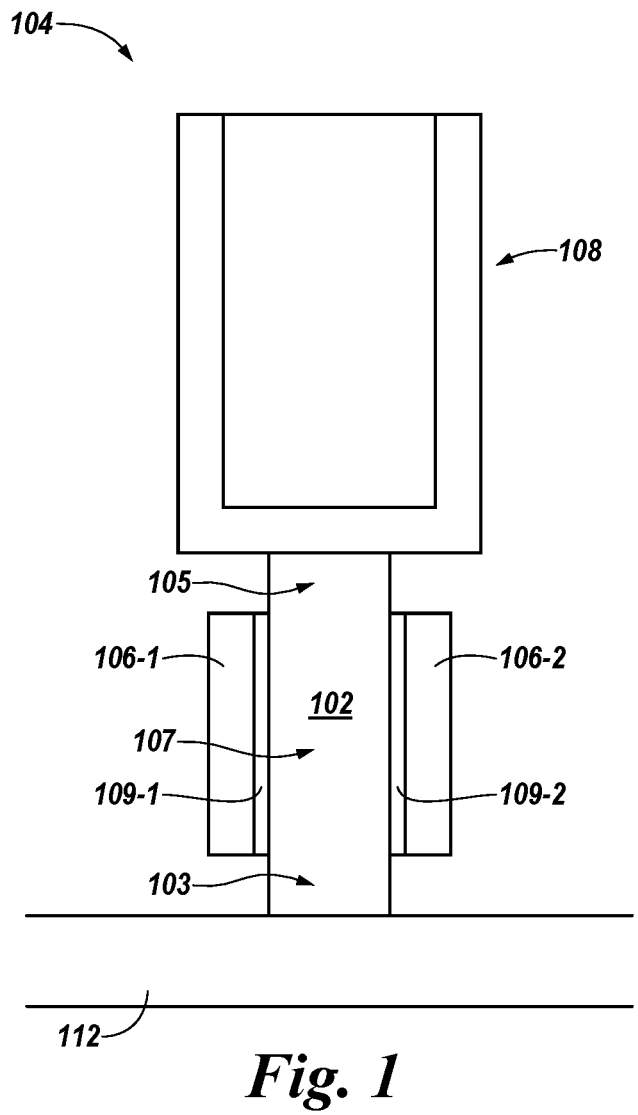
FIG. 1 illustrates an example cross-sectional side views of a memory cell in accordance with a number of embodiments of the present disclosure.

Various types of memory devices, including arrays of volatile and/or non-volatile memory cells (e.g., a memory array) are disclosed, where inhibitors are used to reduce the deposition of dielectric materials in a trench between two semiconductor structures. For example, according to a particular design rule, dielectric material may be deposited between two semiconductor structures that may be formed to a height greater than 150 nanometers (nm). When a dielectric material fills the trenches between the semiconductor structures, air gaps may form. As used herein, the term "air gap" may refer to a region of non-solid space, e.g., a gap, in a dielectric material. With shrinking design rules and increased aspect ratios, air gaps may become more damaging to the memory cells. A process to reduce (e.g., eliminate) air gap formation above the height of access lines when filling in the trenches between semiconductor structures is beneficial. Air gaps forming above the height of access lines in the dielectric material used to fill the trenches may decrease the performance of the memory device in which the trench is formed. Reducing the formation of air gaps may help counteract the decreased performance and also increase a margin for integrated process tuning. Example embodiments herein disclose a process for filling in trenches between semiconductor structures without creating an air gap above the height of an access line.

In some embodiments, the dielectric material used to fill the trenches is an oxide (Ox). In some embodiments, the oxide may be aluminum oxide (AlOx), silicon oxide (SiOx), yttrium oxide (YOx), zirconium oxide (ZrOx), hafnium oxide (HfOx), germanium oxide (GaOx), strontium oxide (SrOx), magnesium oxide (MgOx), among other possible oxides. While examples in the present disclosure discuss filling the trenches with an oxide, embodiments are not so limited and may include other dielectric materials such as silicon nitride ($Si_3N_4$), silicon carbide (SiC), silicon oxycarbide (SiOC), silicon carbon nitride (SiCN), etc.

Filling the trench without forming air gaps above an access line may involve depositing an inhibitor onto the semiconductor structure. The area of the semiconductor structure on which the inhibitor may be deposited may reduce the amount of the dielectric material deposited onto those areas. Dielectric material may be deposited into the trench between the semiconductor structures. Air gaps may be formed in the dielectric material deposited into the trench in the area where the inhibitors were not deposited due to the geometry of the trench and the process used to fill the trench, such as a low-step coverage process. For example, air gaps may be formed more easily in trenches where the top of the trench is more narrow than other trenches. Further, low-step coverage processes such as plasma-enhanced chemical vapor deposition (PECVD) and physical vapor deposition (PVD) may lead to air gap formation due to the bread-loafing effect. As used herein, the term "bread-loafing effect" may refer to semiconductor material accumulating and extending further out at a top corner of a structure on which the semiconductor material is being deposited than on other sections of the structure on which the semiconductor material is being deposited. When bread-loafing occurs between neighboring semiconductor structures, the extended portions of semiconductor material may come in contact with each other and enclose a non-solid space. This may create an air gap. A second dielectric material is deposited on the area where the inhibitor material was previously deposited but is no longer there.

In some embodiments, the inhibitor material may be deposited on the entire length of the semiconductor structures and the trench between them. Passivation material may be deposited to remove a portion of the inhibitor material. A dielectric material may be deposited on the area where the inhibitor material was removed. The dielectric material may seal the non-solid space between the semiconductor structures where the passivation material did not remove the inhibitor material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of pillars lines may refer to at least one pillar.

The figures herein follow a numbering convention in which the first digit or digits correspond to the figure number of the drawing and the remaining digits identify an element or component in the drawing. Similar elements or components between different figures may be identified by the use of similar digits. For example, reference numeral 124 may reference element "24" in FIG. 1, and a similar element may be referenced as 224 in FIG. 2. Multiple analogous elements within one figure may be referenced with a reference numeral followed by a hyphen and another numeral or a letter. For example, 116-1 may reference element 16-1 in FIGS. 1 and 116-2 may reference element 16-2, which may be analogous to element 116-1. Such analogous elements may be generally referenced without the hyphen and extra numeral or letter. For example, elements 116-1 and 116-2 or other analogous elements may be generally referenced as 116.

FIG. 1 illustrates a cross-sectional view of an apparatus 104 having a storage node 108, a transistor 102, access lines 106-1, 106-2 (individually or collectively referred to as access lines 106), and a sense line 112. In some embodiments, the apparatus 104 may be a three-dimensional (3D) DRAM memory cell. In some embodiments, the transistor 102 may be a vertical thin film transistor (TFT) serving as an access device to a memory cell.

The transistor 102 may be a n-channel or p-channel transistor. The transistor 102 may include source/drain regions 103, 105 and a channel 107. The transistor 102 may be configured to electrically couple multiple semiconductor structures. For example, the transistor 102 may be configured to couple the storage node 108 and the sense line 112. In some embodiments, a source/drain region 103 may be coupled to the sense line 112 and the source/drain region 105 may be coupled to the storage node 108.

In some embodiments, the storage node 108 may be a capacitor. The storage node 108 may include two electrical conductors separated by a dielectric material. For ease of illustrated, the two electrical conductors and dielectric material are not illustrated in the drawings. In some embodiments, connecting the transistor 102 to the storage node 108 may create a one transistor one capacitor (1T1C) memory cell.

The access lines 106 may also be referred to as select lines or word lines. Dielectric materials 109-1, 109-2 (individually or collectively referred to as dielectric materials 109) may separate the transistor 102 and the access lines 106. In some embodiments, the dielectric materials 109-1, 109-2 may be the same dielectric material. In some embodiments, the dielectric materials 109-1, 109-2 may be different dielectric materials. In some embodiments, the apparatuses and methods for reducing the formation of air gaps above access lines 106 may occur in any area of a memory device where there is a benefit to reducing unintended communication between neighboring conductive lines. The access lines 106 may be running perpendicular to a plane of the drawing sheet, e.g., coming out of the page. Further, the access lines 106 may run orthogonal to the sense line 112. In the example illustration of FIG. 1, the illustrated sense line 112 is actually recessed into the page, parallel to the plane of the drawing sheet.

Figure 2B:
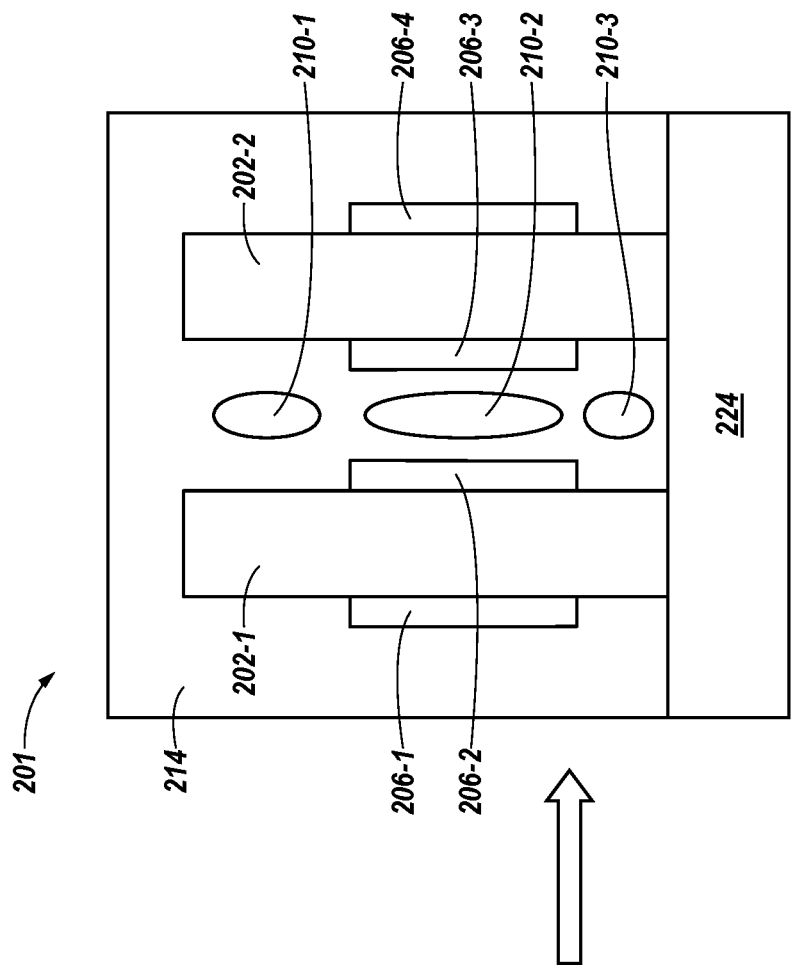
FIGS. 2A-2B illustrate example cross-sectional views of dielectric deposition causing an air gap to form above an access line which may occur in semiconductor structure formation.

A dielectric material (e.g., dielectric material 214 as shown in FIG. 2B) may be deposited between the apparatus 104 and a neighboring semiconductor structure. This deposition may cause air gaps (e.g., air gaps 210-1, 210-2, 210-3 shown in FIG. 2B) to form between the transistor 102 and the neighboring semiconductor structure. Further an inhibitor material (e.g., inhibitor material 322 shown in FIG. 3B) may be deposited over the transistor 102 and the neighboring semiconductor structure to reduce the ability of a dielectric material to adhere and accumulate on the portions of the transistor 102 and neighboring semiconductor structure over which the inhibitor material was deposited. This may reduce the formation of air gaps above the access lines 106.

While embodiments of the present disclosure are discussed relative to reducing capacitive coupling between access lines, the embodiments are not limited to air gap formation between access lines. Embodiments described herein may equally be implemented with the formation of other conductive lines in a semiconductor fabrication process to control air gap formation and placement to reduce capacitive coupling therebetween and improve margin for process integration in the semiconductor fabrication process.

Figure 2A:
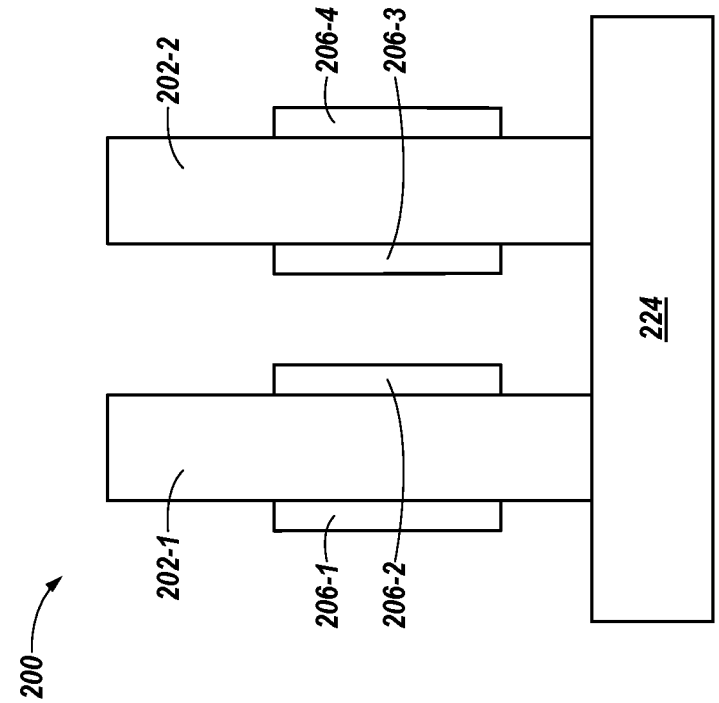

FIGS. 2A-2B illustrate example cross-sectional views of dielectric deposition causing an air gap to form above an access line which may occur in semiconductor structure formation. The process of FIGS. 2A-2B illustrates an implementation other than that described in the present disclosure.

FIG. 2A illustrates a dielectric deposition causing an air gap to form above an access line at a point in time 200 in a semiconductor fabrication process. The semiconductor structures 202-1, 202-2 (individually and collectively referred to as semiconductor structures 202) are formed on a working surface of a substrate material 224. The access lines 206-1, 206-2, 206-3, 206-4 (individually and collectively referred to as access lines 206) may be formed on the sidewalls of the semiconductor structures 202 according to a semiconductor material deposition and removal process.

FIG. 2B illustrates a dielectric deposition causing an air gap above an access line at a point in time 201. A dielectric material 214 may be deposited into a trench between the semiconductor structures 202. The dielectric material 214 may be deposited using PECVD, PVD, or other low-step coverage processes. As the dielectric material is deposited, accumulation on edges of surfaces within high aspect ratio openings may lead to pinching and closure of the high aspect ratio openings before uniform filling can be achieved. As such, regions of non-solid space, e.g., air gaps, may form in unintended and potentially undesirably locations. In the example of FIG. 2B, the dielectric material 214 deposition may cause air gaps 210-1, 210-2, and 210-3 (individually and collectively referred to as air gaps 210) to form. As shown in FIG. 2B, the air gap 210-1 may be formed above the height of the access line and the air gaps 210-2 and 210-3 may be formed at or below the height of the access lines.

FIGS. 3A-3E illustrate example cross-sectional views of a dielectric deposition that reduces the formation of an air gap above an access line in a semiconductor structure in accordance with a number of embodiments of the present disclosure. The process resulting in a reduction of the formation of unintended or undesired air gaps above the access lines in high aspect ratio trenches, as well as an increase in the margin for tuning process integration, illustrated in FIGS. 3A-3E is shown at particular points in time that correspond to particular processing activities being performed in a semiconductor structure formation process. Other processing activities included in a particular semiconductor fabrication sequence may be omitted for ease of illustration.

FIG. 3A illustrates a dielectric deposition that reduces the formation of an air gap above an access line in a semiconductor structure at a point in time 318. Semiconductor structures 302-1 and 302-2 (individually or collectively referred to as semiconductor structures 302) may be formed on active areas of a substrate material 324. Access lines 306-1, 306-2, 306-3, and 306-4 (individually or collectively referred to as access lines 306) may be formed on the sidewalls of the semiconductor structures 302.

FIG. 3B illustrates a dielectric deposition that reduces the formation of an air gap above an access line in a semiconductor structure at a point in time 319. An inhibitor material 322 may be deposited on the semiconductor structures 302. In contrast to other inhibitor materials, which are selective, the inhibitor material 322 may be a time-control deposited inhibitor material. The depth to which the inhibitor material 322 is deposited may be based on the length of time the inhibitor material 322 deposition lasts. This may allow the amount of inhibitor material 322 deposited onto the semiconductor structure 302 and the access lines 306 to be limited and controlled. For example, the longer the deposition of the inhibitor material 322 lasts, the deeper into the trench between the semiconductor structures 302 the inhibitor material 322 may be deposited.

FIG. 3C illustrates a dielectric deposition that reduces the formation of an air gap above an access line in a semiconductor structure at a point in time 325. A dielectric material 314 may be deposited onto the semiconductor structures 302 and the access lines 306. The dielectric material 314 may not adhere and accumulate with the same affinity on the portion of the semiconductor material 302 where the inhibitor material (e.g. inhibitor material 322 in FIG. 3B) was deposited as compared to other exposed surfaces. However, the dielectric material 314 may adhere and accumulate with greater affinity on the portions of the semiconductor structure 302 and the access lines 306 where the inhibitor material was not deposited. The dielectric material 314 may be deposited using PECVD, PVD, or other low step coverage processes. The processes shown in FIGS. 3B-3C may be repeated until the dielectric material 314 fills the trench, sealing the area between the semiconductor structures 302 above the access lines, and intended air gaps are formed between the access lines and/or below the access lines. Air gaps between the access lines may be desirable and intended to achieve a lower dielectric constant (k) value and reduce capacitive coupling between the neighboring access lines. By contrast, air gaps above the access lines may not be intended or desirable as potentially leading to electrical shorts or defects in subsequent processing steps and device formation.

FIG. 3D illustrates a dielectric deposition that reduces the formation of an air gap above an access line in a semiconductor structure at a point in time 327. The dielectric material 314 may fill the trench between the semiconductor structures 302, and air gaps 310-2 and 310-3 (individually or collectively referred to as air gaps 310) may form. In contrast to the process shown in FIGS. 2A-2B, an air gap may not form above the height to the access lines 306. The inhibitor material 322 may prevent the dielectric material 314 from adhering to the semiconductor structures 302 above the access lines 306. Preventing the dielectric material 314 from adhering to the semiconductor structures 302 above the access lines 306 may prevent an air gap or other non-solid space from forming above the access lines 306.

FIG. 3E illustrates a dielectric deposition that reduces the formation of an air gap above an access line in a semiconductor structure at a point in time 329 in a semiconductor fabrication process. An additional material 328 may be deposited over dielectric material 314. Depending on the process being performed, the additional material may be a dielectric material, Si material, metal material, etc. The additional material 328 may be deposited using atomic layer deposition (ALD), a spin-on dielectric process, or any other good step processes. By using ALD or a spin-on dielectric process, the additional material 328 may be deposited without forming an air gap above the access lines 306.

FIGS. 4A-4E illustrate example cross-sectional views of another dielectric deposition that reduces the formation of an air gap above an access line in a semiconductor structure in accordance with a number of embodiments of the present disclosure.

FIG. 4A illustrates a dielectric deposition that reduces the formation of air gaps above an access line in a semiconductor structure at a point in time 432. Semiconductor structures 402-1 and 402-2 (individually or collectively referred to as semiconductor structures 402) may be formed on active areas of a substrate material 424. Access lines 406-1, 406-2, 406-3, and 406-4 (individually or collectively referred to as access lines 406) are formed on the sidewalls of the semiconductor structures 402.

FIG. 4B illustrates a dielectric deposition that reduce the formation of an air gap above an access line in a semiconductor structure at a point in time 433. An inhibitor material 422 may be deposited on the semiconductor structures 402. The inhibitor material 422 may be deposited deeper into the trench between semiconductor structures 402 than the inhibitor material 322 shown in FIG. 3B. The inhibitor material 422 may be deposited deeper than the inhibitor material 322 because the inhibitor 422 may be deposited for a longer period of time than inhibitor material 322 is deposited.

FIG. 4C illustrates a dielectric deposition that reduces the formation of an air gap above an access line in a semiconductor structure at a point in time 439. A dielectric material 414 may be deposited onto the semiconductor structures 402. The dielectric material 414 may be deposited using PECVD, PVD, or other low-step coverage processes. As the dielectric material 414 is deposited, it may begin adhering to the surface at a height that is less than the height of the dielectric material 314 shown in FIG. 3C due to the inhibitor material 422 being deposited to a greater depth than the inhibitor material 322. The process in FIGS. 4B-4C may be repeated until the dielectric material 414 fills the trench between semiconductor structures 402.

FIG. 4D illustrates a dielectric deposition that reduces the formation of an air gap above an access line in a semiconductor structure at a point in time 441. The dielectric material 414 may fill a trench between the semiconductor structures 402 above a portion of the access lines 406. The dielectric material 414 deposition may be continued to fill the trench to a height that is less than the height to which the dielectric material 314 may fill the trench between semiconductor materials 302 in FIG. 3D. Filling the trench between the semiconductor structures 402 with dielectric material 414 may cause intended air gaps 410-2 and 410-3 (individually or collectively referred to as air gaps 410) to form. The inhibitor material (e.g. inhibitor material 422 in FIG. 4B) may be deposited on the semiconductor structures 402 to a depth that includes a portion of the access lines 406. This may result in the dielectric material 414 being deposited to a height that is less than the height of the access lines 406. The air gaps 410 may be formed at a height, lower below the height of the access lines 406 than in FIG. 3D. For example, the air gap 410-2 may be formed at a lower height between the access lines 406 than in FIG. 3D and the air gap 410-3 may still be formed at a height below the access lines 406.

FIG. 4E illustrates a dielectric deposition that reduces the formation of an air gap above an access line in a semiconductor structure at a point in time 442. An additional material 428 may be deposited on the semiconductor structures 402 and the dielectric material 414. The additional material 428 may be deposited using ALD, a spin-on dielectric process, or any other good step process. The additional material 428 may be deposited with reduced air gap formation. The additional material 428 may be the same material or a different material than the dielectric material 414.

FIGS. 5A-5E illustrate example cross-sectional views of another dielectric deposition that reduces the formation of an air gap above an access line in a semiconductor structure in accordance with a number of embodiments of the present disclosure.

FIG. 5A illustrates a dielectric deposition that reduces the formation of an air gap above an access line in a semiconductor structure at a point in time 543. Semiconductor structures 502-1, 502-2 (individually or collectively referred to as semiconductor structures 502) are formed on active areas of a substrate material 524. Access lines 506-1, 506-2, 506-3, and 506-4 (individually or collectively referred to as access lines 506) are formed on the sidewalls of the semiconductor structures 502.

FIG. 5B illustrates a dielectric deposition that reduces the formation of an air gap above an access line in a semiconductor structure at a point in time 544. An inhibitor material 522 may be deposited onto the semiconductor structures 502 and access lines 506. For example, in contrast to FIGS. 3B and 4B, the inhibitor material 522 may be deposited over the entire length of the semiconductor structures 502, the access lines 506, and the trench formed between the semiconductor structures 502.

FIG. 5C illustrates a dielectric deposition process that reduces the formation of an air gap above an access line in a semiconductor structure at a point in time 545. A passivation material, not pictured, may be deposited on the semiconductor structures 502. The passivation material may be used to remove a portion of the inhibitor material 522. For example, the passivation material may be used to remove a portion of the inhibitor material 522 on the sidewalls of the semiconductor structures 502 that is above the access lines 506.

FIG. 5D illustrates a dielectric deposition process that reduces the formation of an air gap above an access line in a semiconductor structure at a point in time 546. A dielectric material 514 may be deposited onto the semiconductor structures 502. The dielectric material 514 may adhere to the portion of the semiconductor structure 502 where the passivation material removed the inhibitor material (e.g. inhibitor material 522 as shown in FIGS. 5B-5C). For example, the dielectric material 514 may be deposited on the semiconductor structures 502 above the access lines 506. The dielectric material 514 may be deposited using ALD, a spin-on dielectric process, or any other good step process. The process described in FIGS. 5B-5D may be repeated until the dielectric material 514 provides a conformal layer on the semiconductor structure 502 in the area above the access lines 506.

FIG. 5E illustrates a dielectric deposition process to reduce the formation of an air gap above an access line in a semiconductor structure at a point in time 547. The dielectric material 514 may be deposited to fill in the area above the access lines 506. This may seal a non-solid space in the area under the dielectric material 514. The non-solid space may function as a dielectric between the neighboring semiconductor structures 502. This process may maximize the non-solid space to achieve a reduced dielectric constant (k) value in comparison to depositing a dielectric material. The non-solid space may have a low dielectric constant (k). For example, the k of the non-solid space may have an approximate value of 1.

FIGS. 6A-6E illustrate example cross-sectional views of another dielectric deposition that reduces the formation of an air gap above an access line in a semiconductor structure in accordance with a number of embodiments of the present disclosure.

FIG. 6A illustrates a dielectric deposition that reduces the formation of an air gap above an access line in a semiconductor structure at a point in time 648. Semiconductor structures 602-1 and 602-2 (individually or collectively referred to as semiconductor structures 602) are formed on active areas of a substrate material 624. Access lines 606-1, 606-2, 606-3, and 606-4 (individually or collectively referred to as access lines 606) are formed on the sidewalls of the semiconductor structures 602.

FIG. 6B illustrates a dielectric deposition that reduces the formation of an air gap above an access line in a semiconductor structure at a point in time 649. An inhibitor material 622 may be deposited on the semiconductor material 602 and the access lines 606. For example, the inhibitor material 622 may be deposited over the length of the semiconductor structures 602, access lines 606, and within the trench between semiconductor structures 602.

FIG. 6C illustrates a dielectric deposition process that reduces the formation of an air gap above an access line in a semiconductor structure at a point in time 650. A passivation material (not pictured) may be deposited onto the semiconductor structures 602. The passivation material may remove a portion of the inhibitor material 622 from the semiconductor structures 602. The time of the passivation material deposition may be tuned to remove more or less inhibitor material 622 than is shown in FIG. 6C. The passivation material may remove less inhibitor material 622 in FIG. 6C than inhibitor material 522 in FIG. 5C. Less inhibitor material 622 may be removed in FIG. 6C because the passivation material used to remove the inhibitor material 622 may have been deposited for a shorter length of time than the passivation material used to remove the inhibitor material 522 in FIG. 5C. In this embodiment, the passivation material may remove the inhibitor material to some depth above the access lines.

FIG. 6D illustrates a dielectric deposition that reduces the formation of an air gap above an access line in a semiconductor structure at a point in time 651. A dielectric material 614 may be deposited on the semiconductor structures 602. The dielectric material 614 may be deposited using ALD, a spin-on dielectric process, or any other good step processes. The dielectric material 614 may be deposited to a lesser depth than the dielectric material 514 in FIG. 5C because the passivation material may remove more of the inhibitor material 522 in FIG. 5C than the inhibitor material 622 in FIG. 6D. The process shown in FIGS. 6B-6D may be repeated until the dielectric material 614 provides a conformal layer on the semiconductor structure 602 in the area where the passivation material removed the inhibitor material 622, as shown in FIG. 6E.

FIG. 6E illustrates a dielectric deposition process to reduce the formation of an air gap above an access line in a semiconductor structure at a point in time 652. In FIG. 6E, the dielectric material 614 may be deposited on the semiconductor structures 602 at a height above the access lines 606. The dielectric material 614 may fill in the space above the access lines 606. This may seal the non-solid space below the dielectric material 614.

Figure 7:
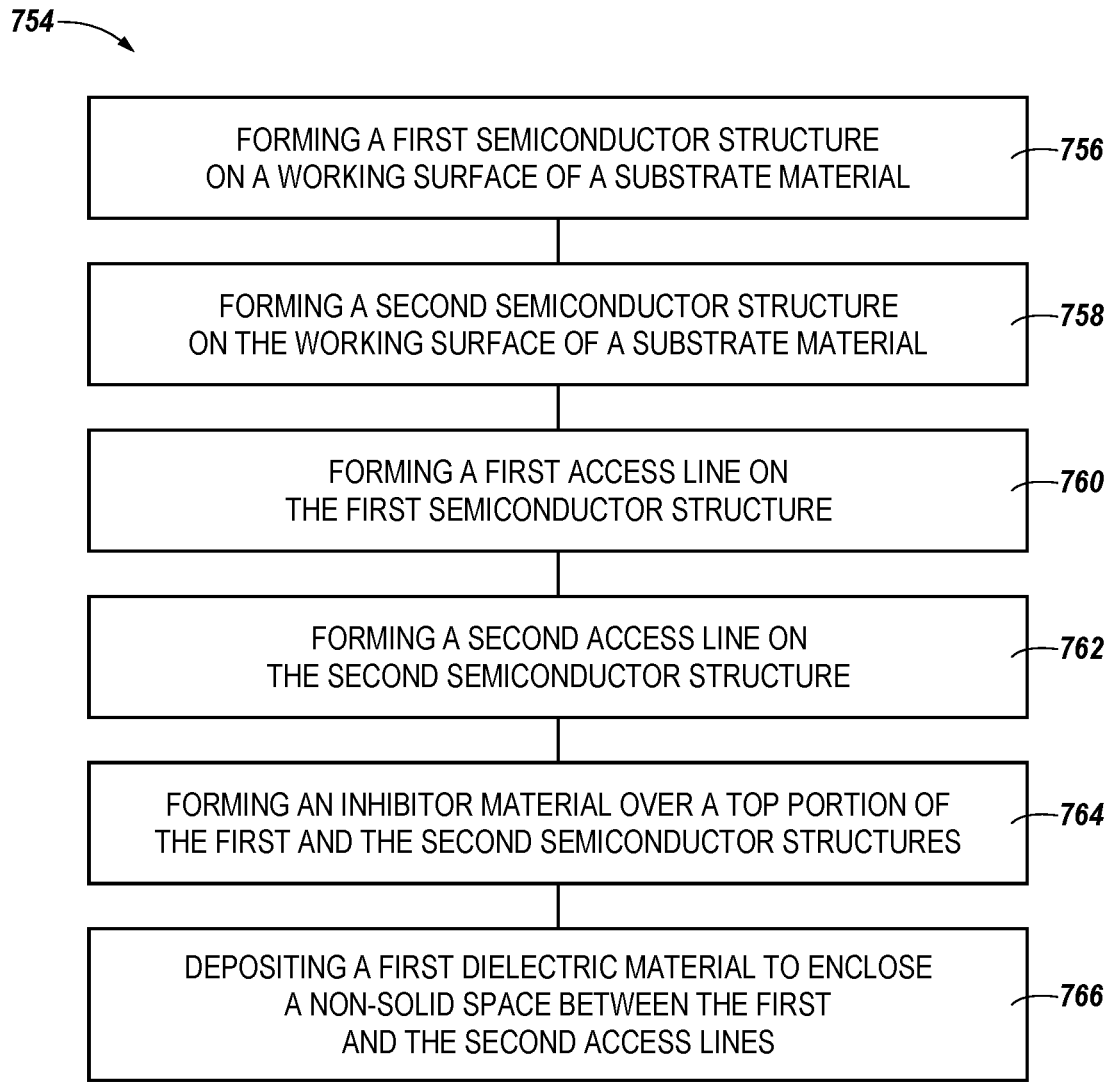
FIG. 7 is a flow diagram of an example method for reducing the formation of air gaps above an access line in semiconductor structures in accordance with a number of embodiments of the present disclosure.

FIG. 7 is a flow diagram of an example method 754 for reducing the formation of an air gap above an access line in semiconductor structures in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 756, the method 754 may include forming a first semiconductor structure on a working surface of a substrate material. At block 758, the method 754 may include forming a second semiconductor structure on a working surface of a substrate material. The height of the semiconductor structures may be in a range of 50-1000 nm. In some embodiments, the height of the semiconductor structures may be 200 nm. The diameter of the semiconductor structures may be in a range of 10-200 nm. In some embodiments, the diameter of the semiconductor structures may be 20 nm. Although FIGS. 2A-6E show the semiconductor structures as rectangular, embodiments of the present invention are not limited to a rectangular shape. For example, the top of the semiconductor structures may have a different diameter than the bottom of the semiconductor structure.

At block 760, the method 754 may include forming a first access line on the first semiconductor structure. At block 762, the method 754 may include forming a second access line on the second semiconductor structure. The access lines may be neighboring access lines formed on the sidewalls of the semiconductor structures.

At block 764, the method 754 may include forming an inhibitor material over a top portion of the first and second semiconductor structures. In contrast to previous inhibitor materials, which are selective, the present inhibitor material may be time-based. This means the inhibitor material may adhere to multiple semiconductor structures and the amount of inhibitor material that adheres to the semiconductor structures is based on the length of time of the deposition of the inhibitor material. This may allow for the deposition of the inhibitor material to be adjustable. Adjusting the length of time in which the inhibitor material will be deposited may adjust the depth to which the inhibitor material is deposited within the trench. Adjusting the depth to which the inhibitor material is deposited within the trench may adjust the height to which the dielectric material is deposited. Adjusting the height to which the dielectric material is deposited may adjust the height of the air gaps. This method may also be used to increase the margin for integrated process tuning.

At block 766, the method 754 may include depositing a first dielectric material to enclose a non-solid space between the first and the second access lines. The dielectric material may be deposited to fill the trench between the semiconductor structures. Depositing the dielectric material to fill the trench may cause air gaps to form. In some embodiments, multiple air gaps may form. For example, an air gap may form between the access lines at a similar height to the access lines (e.g. air gap 310-2 shown in FIG. 3D). An air gap may also form below the height of the access lines (e.g. air gap 310-3 shown in FIG. 3D). Since the inhibitor material may reduce the amount of dielectric material deposited in the trench at a height above the access lines, air gaps may not form at a height above the access lines.

Figure 8:
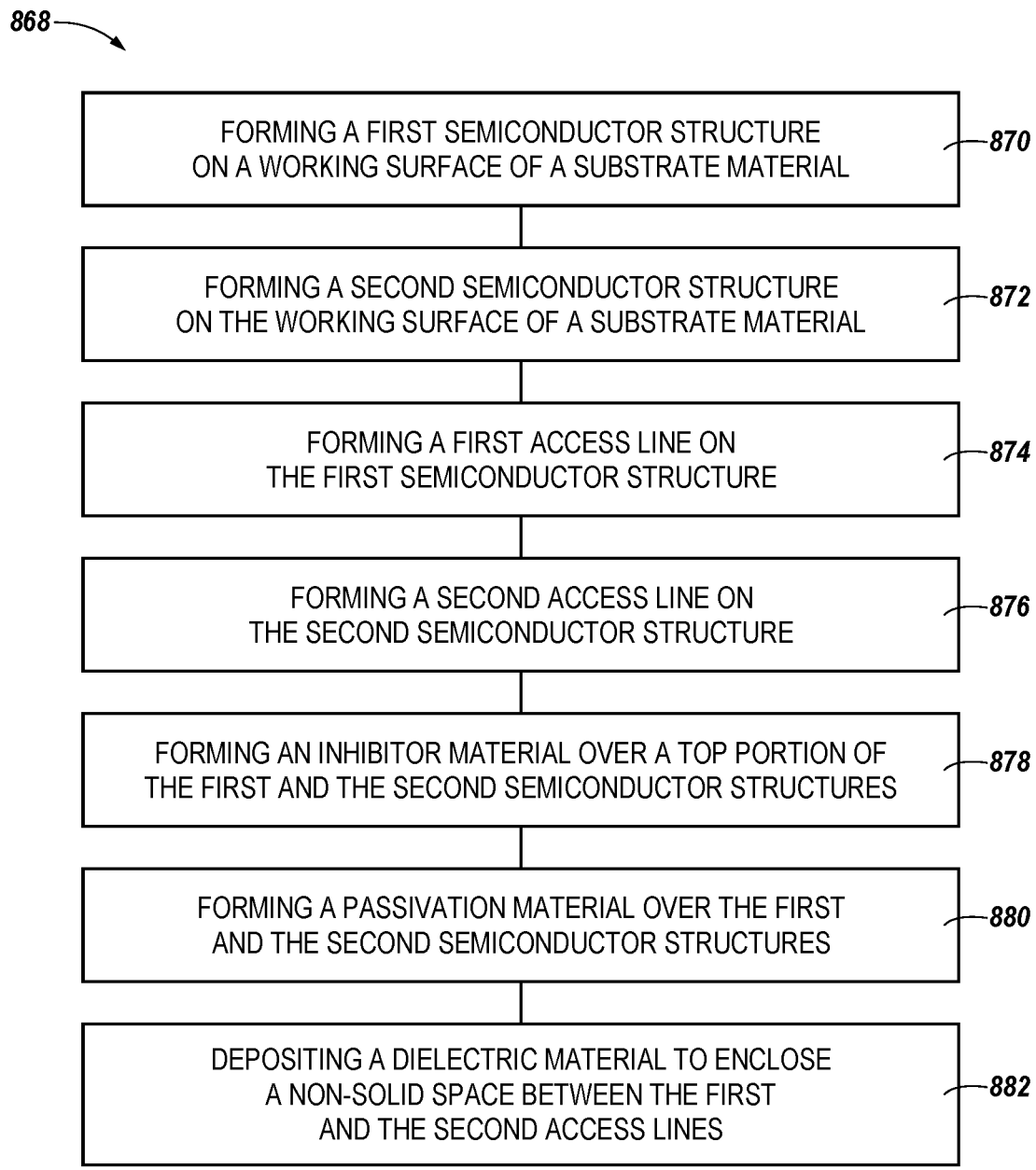
FIG. 8 is a flow diagram of another example method for reducing the formation of air gaps above an access line in semiconductor structures in accordance with a number of embodiments of the present disclosure.

FIG. 8 is a flow diagram of another example method for growth inhibition in semiconductor structures in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 870, the method 868 may include forming a first semiconductor structure on a working surface of a substrate material. At block 872, the method 868 may include forming a second semiconductor structure on a working surface of a substrate material. The width of the space between the tops of neighboring semiconductor structures may be in a range between 5-50 nm. In some embodiments, the width of the space between the tops of neighboring semiconductor structures may be 15 nm. The width of the space between the bottoms of neighboring semiconductor structures may be in a range of 5-50 nm. In some embodiments, the width of the space between the bottoms of neighboring semiconductor structures may be 15 nm.

At block 874, the method 868 may include forming a first access line on the first semiconductor structure. At block 876, the method 868 may include forming a second access line on the second semiconductor structure. The access lines may be formed on the sidewalls of neighboring semiconductor surfaces.

At block 878, the method 868 may include forming an inhibitor material over a top portion the first and the second semiconductor structures. The inhibitor material may be a time-control deposited inhibitor material. The inhibitor material may be deposited to fill the trench between neighboring semiconductor structures. The inhibitor material may be deposited on a semiconductor structure above the access line, on the access line, and below the access line.

At block 880, the method 868 may include forming a passivation material over the first and second semiconductor structures. The passivation material may be used to remove a portion of the inhibitor material. Similar to the inhibitor material, the passivation material may also be time-control deposited. The longer the deposition of the passivation material lasts, the more inhibitor material will be removed by the passivation material. In some embodiments, the passivation material may be deposited to remove the inhibitor material above the access lines.

At block 882, the method 868 may include depositing a dielectric material to enclose a non-solid space between the first and second access lines. The dielectric material may be deposited on portions of the semiconductor structures in which the passivation material removed the inhibitor material. In some embodiments, the dielectric material is deposited onto a portion of the semiconductor structures that is above the access lines because the passivation material removed the inhibitor material above the access lines. The dielectric material may be deposited to fill in the space above the access lines. This may seal the non-solid space in the trench under the dielectric material.

Figure 9:
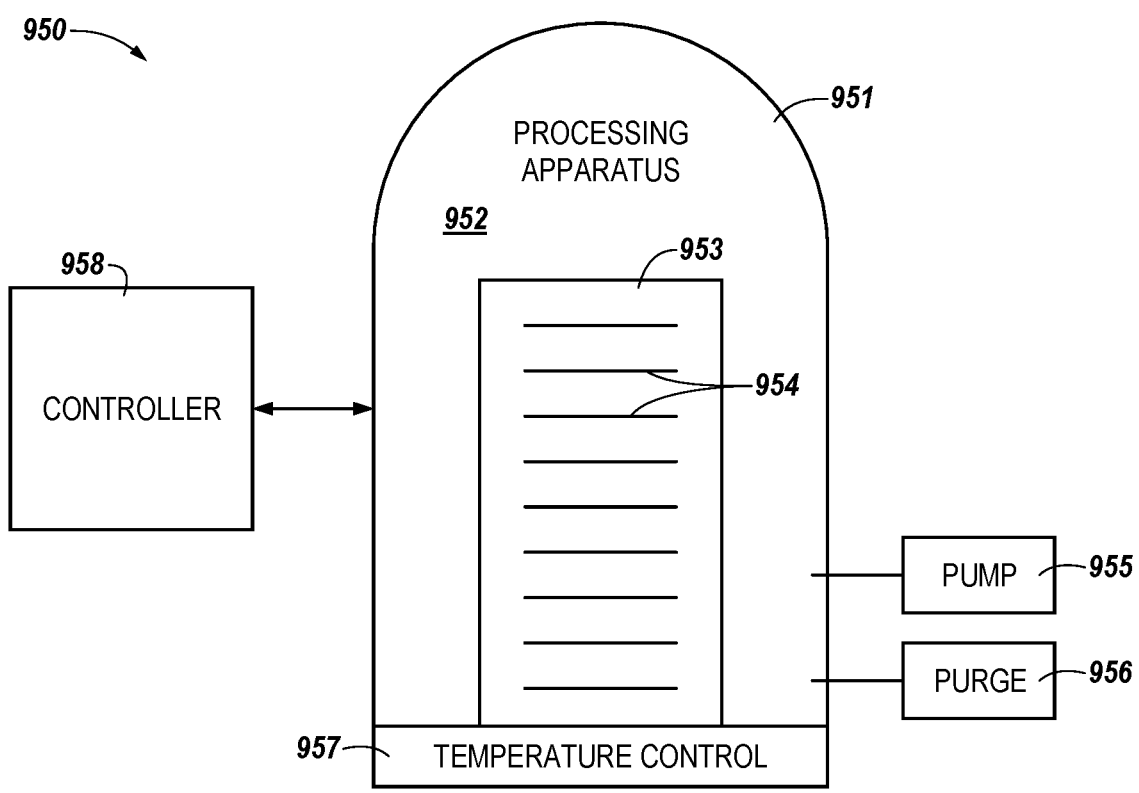
FIG. 9 is a functional block diagram of a system for implementation of an example semiconductor fabrication process in accordance with a number of embodiments of the present disclosure.

FIG. 9 is a functional block diagram of a system 950 for implementation of an example semiconductor fabrication process in accordance with a number of embodiments of the present disclosure. The numbering convention used in connection with FIG. 9 does not follow the earlier introduced numbering convention and sequence that applies to FIGS. 1-8. The system 950 may include a processing apparatus 951. The processing apparatus 951 may be configured to enable formation of structural materials on and/or removal of structural materials from a semiconductor device during fabrication of the semiconductor device. While FIG. 9 illustrates a batch processing tool, embodiments are not so limited and may include other types of processing tools, such as a single chamber processing tool.

FIG. 9 illustrates an example processing apparatus 951 that may be used in a semiconductor fabrication process. The processing apparatus 951 may include a chamber 952 to enclose components configured to perform deposition and/or etch operations on a number of semiconductor devices. The chamber 952 may further enclose a carrier 953 to hold a batch of semiconductor wafers 954. The processing apparatus 951 may include and/or be associated with tools including, for example, a pump 955 unit and a purge 956 unit configured to introduce and remove appropriate etch chemistries, as described herein, at each point in the semiconductor fabrication sequence. The processing apparatus 951 may further include a temperature control 957 unit configured to maintain the chamber 952 at an appropriate temperature at each of the points in the fabrication sequence. The system 950 may include a number of chambers 952 that are each configured to perform particular processes (e.g., a wet etch process, a dry etch process, and/or a deposition process, among others) during the fabrication sequence.

The system 950 may further include a controller 958. The controller 958 may include, or be associated with, circuitry and/or programming for implementation of, for instance, semiconductor structure formation. Adjustment of such deposition, removal, and etching operations by the controller 958 may control the critical dimensions (CDs) of the semiconductor devices created in the processing apparatus 951.

A host may be configured to generate instructions related to semiconductor structure formation. The instructions may be sent via a host interface to the controller 958 of the processing apparatus 951. The instructions may be based at least in part on scaled preferences (e.g., in numerically and/or structurally defined gradients) stored by the host, provided via input from another storage system (not shown), and/or provided via input from a user (e.g., a human operator), among other possibilities. The controller 958 may be configured to enable input of the instructions and scaled preferences to define the CDs of the fabrication of the semiconductor device to be implemented by the processing apparatus 951.

The scaled preferences may determine final structures (e.g., the CDs) of neighboring semiconductor structures and access lines. Particular CDs may be enabled by the particular scaled preferences that are input via the instructions. Receipt and implementation of the scaled preferences by the controller 958 may result in corresponding adjustment, by the processing apparatus 951, of the characteristics of the semiconductor structure that is formed, among implementation of other possible scaled preferences.

The controller 958 may, in a number of embodiments, be configured to use hardware as control circuitry. Such control circuitry may, for example, be an application specific integrated circuit (ASIC) with logic to control fabrication steps, via associated deposition and etch processes, for semiconductor structure formation. The controller 958 may be configured to receive the instructions and direct performance of operations to perform the semiconductor structure formation methods as described in connection with FIGS. 3A-3E, 4A-4E, 5A-5E, and 6A-6E.

Figure 10:
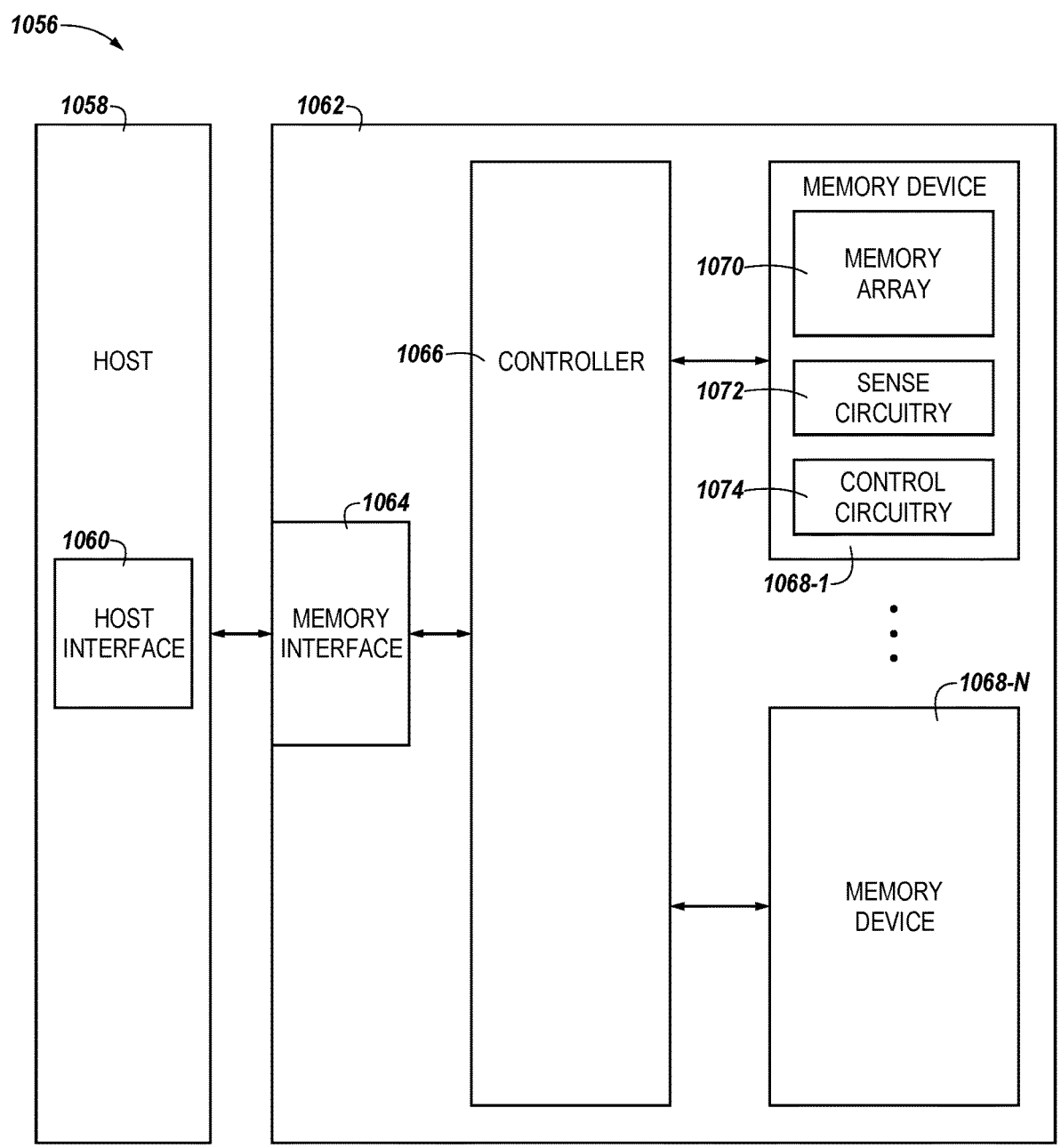
FIG. 10 is a functional block diagram of a computing system including at least one memory array having memory cells formed in accordance with a number of embodiments of the present disclosure.

FIG. 10 is a functional block diagram of a computing system 1056 including at least one memory system 1062 in accordance with one or more embodiments of the present disclosure. The numbering convention used in connection with FIG. 10 does not follow the earlier introduced numbering convention and sequence that applies to FIGS. 1-8. Memory system 1062 may be, for example, a solid-state drive (SSD).

In the embodiment illustrated in FIG. 10, memory system 1062 includes a memory interface 1064, a number of memory devices 1068-1, . . . , 1068-N, and a controller 1066 selectably coupled to the memory interface 1064 and memory devices 1068-1, . . . , 1068-N. Memory interface 1064 may be used to communicate information between memory system 1062 and another device, such as a host 1058. Host 1058 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host 1058 may be associated with fabrication operations performed on semiconductor devices and/or SSDs using, for example, a processing apparatus shown at 951 and described in connection with FIG. 9.

In a number of embodiments, host 1058 may be associated with (e.g., include or be coupled to) a host interface 1060. The host interface 1060 may enable input of scaled preferences (e.g., in numerically and/or structurally defined gradients) to define, for example, critical dimensions (CDs) of a final structure or intermediary structures of a memory device (e.g., as shown at 1068) and/or an array of memory cells (e.g., as shown at 1070) formed thereon to be implemented by the processing apparatus 951. The array includes access devices having semiconductor structures, access lines, and dielectric material formed according to embodiments described herein. The scaled preferences may be provided to the host interface 1060 via input of a number of preferences stored by the host 1058, input of preferences from another storage system (not shown), and/or input of preferences by a user (e.g., a human operator).

Memory interface 1064 may be in the form of a standardized physical interface. For example, when memory system 1062 is used for information (e.g., data) storage in computing system 1056, memory interface 1064 may be a serial advanced technology attachment (SATA) interface, a peripheral component interconnect express (PCIe) interface, or a universal serial bus (USB) interface, among other physical connectors and/or interfaces. In general, however, memory interface 1064 may provide an interface for passing control, address, information, scaled preferences, and/or other signals between the controller 1066 of memory system 1062 and a host 1058 (e.g., via host interface 1060).

Controller 1066 may include, for example, firmware and/or control circuitry (e.g., hardware). Controller 1066 may be operably coupled to and/or included on the same physical device (e.g., a die) as one or more of the memory devices 1068-1, . . . , 1068-N. For example, controller 1066 may be, or may include, an ASIC as hardware operably coupled to circuitry (e.g., a printed circuit board) including memory interface 1064 and memory devices 1068-1, . . . , 1068-N. Alternatively, controller 1066 may be included on a separate physical device that is communicatively coupled to the physical device (e.g., the die) that includes one or more of the memory devices 1068-1, . . . , 1068-N.

Controller 1066 may communicate with memory devices 1068-1, . . . , 1068-N to direct operations to sense (e.g., read), program (e.g., write), and/or erase information, among other functions and/or operations for management of memory cells. Controller 1066 may have circuitry that may include a number of integrated circuits and/or discrete components. In a number of embodiments, the circuitry in controller 1066 may include control circuitry for controlling access across memory devices 1068-1, . . . , 1068-N and/or circuitry for providing a translation layer between host 1058 and memory system 1062.

Memory devices 1068-1, . . . , 1068-N may include, for example, a number of memory arrays 1070 (e.g., arrays of volatile and/or non-volatile memory cells). For instance, memory devices 1068-1, . . . , 1068-N may include arrays of memory cells, such as a portion of an example memory device structured to include access lines on the sidewalls of semiconductor structures. At least one array includes an access device having a access lines on the sidewalls of semiconductor structures formed according to the embodiments disclosed herein. As will be appreciated, the memory cells in the memory arrays 1070 of memory devices 1068-1, . . . , 1068-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 1068 may be formed on the same die. A memory device (e.g., memory device 1068-1) may include one or more arrays 1070 of memory cells formed on the die. A memory device may include sense circuitry 1072 and control circuitry 1074 associated with one or more arrays 1070 formed on the die, or portions thereof. The sense circuitry 1072 may be utilized to determine (sense) a particular data value (e.g., 0 or 1) that is stored at a particular memory cell in a row of an array 1070. The control circuitry 1074 may be utilized to direct the sense circuitry 1072 to sense particular data values, in addition to directing storage, erasure, etc., of data values in response to a command from host 1058 and/or host interface 1060. The command may be sent directly to the control circuitry 1074 via the memory interface 1064 or to the control circuitry 1074 via the controller 1066.

The embodiment illustrated in FIG. 10 may include additional circuitry that is not illustrated so as not to obscure embodiments of the present disclosure. For example, memory device 1068 may include address circuitry to latch address signals provided over I/O connectors through I/O circuitry. Address signals may be received and decoded by a row decoder and a column decoder to access a memory array 1070. It will be appreciated that the number of address input connectors may depend on the density and/or architecture of memory devices 1068 and/or memory arrays 1070.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, oxide materials, nitride materials, buffer materials, etch chemistries, etch processes, solvents, memory devices, memory cells, openings, among other materials and/or components related to patterning a material over an active area for a storage node contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, oxide materials, nitride materials, buffer materials, etch chemistries, etch processes, solvents, memory devices, memory cells, sidewalls of openings and/or trenches related to patterning a material over an active area for a storage node contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a working surface of a substrate material;
   a trench formed between semiconductor structures on the working surface of the substrate material;
   access lines formed on neighboring sidewalls of the semiconductor structures opposing a channel region separating a first source/drain region and a second source/drain region;
   a time-control formed inhibitor material formed over a portion of the sidewalls of the semiconductor structures to limit inhibitor material coverage on the sidewalls of the access lines; and
   a dielectric material formed over the semiconductor structures to enclose a non-solid space between the access lines.

2. The apparatus of claim 1, wherein the time-control formed inhibitor material is formed on a portion of the sidewalls of the semiconductor structures that is above a height of the access lines.

3. The apparatus of claim 1, wherein the non-solid space is formed at a height below a top of the access lines, but not above the access lines.

4. The apparatus of claim 3, wherein multiple non-solid spaces are formed in the trench below the top of the access lines.

5. The apparatus of claim 1, wherein the dielectric material is formed using plasma-enhanced chemical vapor deposition (PECVD).

6. The apparatus of claim 1, wherein an additional dielectric material is formed over the dielectric material.

7. The apparatus of claim 6, wherein the additional dielectric material is an atomic layer deposition (ALD) deposited dielectric material.

8. The apparatus of claim 6, wherein the additional dielectric material is a spin-on dielectric deposited dielectric material.

9. The apparatus of claim 1, wherein the time-control formed inhibitor material prevents non-solid space formation above the access lines.

10. The apparatus of claim 1, wherein the apparatus is a vertical thin film transistor (TFT) serving as an access device to a memory cell.

11. An apparatus, comprising:
    a working surface of a substrate material;
    a trench formed between semiconductor structures formed on the working surface of the substrate material;
    access lines formed on neighboring sidewalls the semiconductor structures;
    a time-control formed inhibitor material formed over the sidewalls of the semiconductor structures;
    a time-control formed passivation material formed over a portion of the sidewalls of the semiconductor structures; and
    a dielectric material formed over the semiconductor structures to enclose a non-solid space between the access lines.

12. The apparatus of claim 11, wherein the time-control formed inhibitor material is formed on the access lines.

13. The apparatus of claim 11, wherein the time-control formed inhibitor material is formed on a portion of the semiconductor structures that is above the access lines and the time-control formed inhibitor material is formed on a portion of the semiconductor structures that is below the access lines.

14. The apparatus of claim 11, wherein the time-control formed passivation material is formed from oxygen plasma.

* * * * *